(12) United States Patent
Park et al.

(10) Patent No.: US 7,791,320 B2
(45) Date of Patent: Sep. 7, 2010

(54) VOLTAGE REGULATOR FOR USE IN NONVOLATILE SEMICONDUCTOR MEMORY

(75) Inventors: Sang-kug Park, Bucheon-si (KR); Dae-Han Kim, Gangdong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 435 days.

(21) Appl. No.: 11/844,508

(22) Filed: Aug. 24, 2007

(65) Prior Publication Data

US 2008/0150499 A1    Jun. 26, 2008

(30) Foreign Application Priority Data

Dec. 26, 2006    (KR) .................. 10-2006-0133518

(51) Int. Cl.
    G05F 1/59    (2006.01)
(52) U.S. Cl. .................. 323/268; 323/274; 323/284
(58) Field of Classification Search .................. 323/274, 323/284, 268; 363/59, 60, 61
    See application file for complete search history.

(56) References Cited

U.S. PATENT DOCUMENTS

| 5,835,420 | A | 11/1998 | Lee et al. | |
|---|---|---|---|---|
| 6,954,055 | B2 * | 10/2005 | Umemoto et al. | 323/284 |
| 7,180,274 | B2 * | 2/2007 | Chen et al. | 323/222 |
| 7,304,464 | B2 * | 12/2007 | Weng et al. | 323/285 |
| 7,417,412 | B2 * | 8/2008 | Koh | 323/285 |
| 2003/0052659 | A1 * | 3/2003 | Monomoushi et al. | 323/284 |
| 2008/0088290 | A1 * | 4/2008 | So | 323/284 |
| 2009/0016084 | A1 * | 1/2009 | Trattler | 363/60 |
| 2009/0146631 | A1 * | 6/2009 | Fukumori | 323/284 |

FOREIGN PATENT DOCUMENTS

DE    102005012662 A1 *    9/2006
WO    WO 2007/007752 A1 *    1/2007

\* cited by examiner

*Primary Examiner*—Jeffrey L Sterrett
(74) *Attorney, Agent, or Firm*—Volentine & Whitt, PLLC

(57) ABSTRACT

The invention relates to a voltage regulator for operation of a semiconductor memory device. In embodiments, the voltage regulator includes a standby regulator unit and an active regulating unit. Embodiments of the invention decouple the operation of the standby regulating unit and the active regulating unit of a voltage regulator so that both can operate simultaneously, for example during a read operation. In embodiments of the invention, the standby regulating unit includes a short pulse generator and a feedback loop to disable the standby regulating unit for a predetermined amount of time.

15 Claims, 5 Drawing Sheets

VOLTAGE REGULATOR FOR USE IN NONVOLATILE SEMICONDUCTOR MEMORY

CROSS REFERENCE TO RELATED APPLICATIONS

This application claims priority under 35 U.S.C. §119 from Korean Patent Application 10-2006-0133518, filed on Dec. 26, 2006, the contents of which are hereby incorporated by reference in their entirety for all purposes as if fully set forth herein.

BACKGROUND OF THE INVENTION

1. Field of the Invention

The present invention relates to a nonvolatile semiconductor memory. More particularly, but not by way of limitation, the present invention relates to a voltage regulator and a voltage regulation method associated with a voltage that is applied to a control gate of a memory cell transistor and accumulated in a floating gate of the memory cell.

2. Description of the Related Art

Information processing apparatuses such as a portable multimedia player, computer, etc. tend to require high speed operation and large capacity in semiconductor memory devices employed therein.

A semiconductor memory device may be classified as a volatile semiconductor memory device or a nonvolatile semiconductor memory device. The volatile semiconductor memory device classification includes dynamic random access memory (DRAM) and static random access memory (SRAM). Volatile semiconductor memory devices have fast read and write speed, but contents stored in such a memory cell are lost when an external power supply is cut off.

The nonvolatile semiconductor memory device classification includes mask read only memory (MROM), programmable read only memory (PROM), erasable programmable read only memory (EPROM), and electrically erasable programmable read-only memory (EEPROM).

Such nonvolatile semiconductor memory devices have been typically used to store contents that must be preserved even when an external power supply is cut off. It is not easy to erase or re-program MROM, PROM, and EPROM devices from host system. Erase and write operations can be more easily performed in EEPROM by a host system.

Many electronic devices require high density EEPROM. Moreover, a data storage device such as a digital camera etc. is required to be compact in the size. In using a hard disk device having a rotary magnetic disk as an auxiliary memory device in a battery-power computer system based on a portable computer or notebook computer size, it needs to occupy a relatively wide area, thus designers of these systems are very interested in a development of EEPROM occupying a relatively smaller area and having a relatively higher density and higher performance.

Flash EEPROM having a flash erase function have been developed. The flash EEPROM may be a NAND, NOR or AND type, depending upon how memory cell arrays are configured. For example, a memory cell array of a typical NOR-type flash EEPROM comprises bit lines for providing and receiving data with memory cell transistors, and word lines that form a matrix with the bit lines to control gates of the memory cell transistors.

Each memory cell transistor of the NOR memory cell array is constructed of a MOS transistor having a floating gate formed by interposing a gate oxide in a channel region between source and drain regions and a control gate formed on the floating gate through an interlayer insulation layer. In operation, a program voltage is applied to the control gate CG and is accumulated in the floating gate FG.

A nonvolatile semiconductor memory device having such memory cell has various operating modes, for example, program (write), erase, read, program verify and erase verify. In each of these operating modes, voltage applied to the control gate of the memory cell transistor may be a high voltage level output from a high voltage pumping circuit.

An example for a voltage regulator in such nonvolatile semiconductor memory device is disclosed in U.S. Pat. No. 5,835,420 published on Nov. 10, 1998.

In a NOR type flash memory cell, a single level cell storing a single bit may be changed into a multilevel cell (MLC) storing multiple bits. In this instance, the effects of a read voltage level on a sensing margin increase. That is, when the read voltage level is stabilized, the sensing margin can increase. Conversely, when the read voltage is unstable, the sensing margin decreases, causing read error.

FIG. 1 is a block diagram of a voltage supplier in a nonvolatile semiconductor memory according to the conventional art. Referring to FIG. 1, there is shown a voltage supplier comprising a control circuit 400, an oscillator 200, a high voltage pump 100 and a regulator 300.

The control circuit 400 generates an oscillating enable signal Osc_Enable and an Active signal in response to first and second detection signals too_low and too_high from the regulator 300. The oscillator 200 performs an oscillation in response to the oscillating enable signal Osc_Enable and generates a pumping clock Pump_Clk. The high voltage pump 100 performs charge pumping in response to the pumping clock Pump_Clk, and outputs a voltage on node ND1. The regulator 300 detects a level of the voltage on node ND1, generates the first and second detection signals too_low and too_high, and receives the Active signal provided by the control circuit 400. A terminal Vwl_read of the regulator 300 is the same as the node ND1, and becomes a detection terminal and also a voltage output terminal.

FIG. 2 is a circuit diagram of the regulator in FIG. 1, according to the conventional art. FIG. 3 is a timing diagram for signals identified in FIG. 2.

Referring first to FIG. 2, a regulator 300 includes a standby regulating unit 321 and an active regulating unit 331. The regulator 300 detects the output of the high voltage pump 100 at detection output terminal Vwl_read, and maintains the output of the high voltage pump 100 using a reference voltage Vref. When the regulator 300 outputs the too_low detection signal, the control circuit 400 outputs the Active signal. As shown in FIG. 3, the Active signal has a phase opposite to that of the Standby signal that is internal to the Regulator 300. Accordingly, the standby regulating unit 321 and the active regulating unit 331 alternately perform a voltage regulating operation.

A time constant RC value based on resistances R0 and R1 of the standby regulating unit 321 is greater than a time constant RC value based on resistances R100 and R101 of the active regulating unit 331 to substantially reduce standby current Isb. The ratio of the resistance values in the standby regulating unit 321 is the same as the ratio of the resistance values in the active regulating unit 331 (i.e., R0/R1=R100/R101). But the total resistance value in the standby regulating unit 321 is much greater than total resistance value in the active regulating unit 331 (i.e., (R0+R1)>>(R100+R101)). Thus, a response speed of the standby regulating unit 321 is slower than that of the active regulating unit 331.

For example, in a section between time points t1 and t2 of FIG. 3, when the Active signal is disabled, a voltage level of detection output terminal Vwl_read starts to gradually fall towards a first level L1 by a leakage current [Ileak (Ileak>>Isb)]. At this time, the standby regulating unit 321 is enabled and so it operates until detecting a low signal too_low. When the voltage level of the detection output terminal Vwl_read falls to the first level L1, a voltage level of a first divided-voltage detection output terminal Node_A becomes lower than a level of the predetermined reference voltage Vref, and a comparator OPA0 outputs a first detection signal, the low signal too_low, which requires a voltage level increase of the detection output terminal Vwl_read. The control circuit 400 enables the Active signal when the signal too_low is received. At this time, the high voltage pump 100 of FIG. 1 also performs a charge pumping operation. When the active regulating unit 331 is enabled and starts to operate, a PMOS transistor MP1 is turned off, and an inverter INV0 inverts a Standby signal to be at a logic low level, and PMOS transistor MP0 is turned on. A turn-on operation of the PMOS transistor MP0 applies a power voltage VDD to the first divided-voltage detection output terminal Node_A until the comparator OPA1 of the active regulating unit 331 detects a signal too_high. As a result, at a section of from time points t2 to t3 of FIG. 3, the active regulating unit 331 is enabled until the too_high signal is generated as a logic high level after a time point t3. After that, the PMOS transistor MP0 is turned off, and the initialization operation of the first divided-voltage detection output terminal Node_A is stopped. When the too_high signal is applied to the control circuit 400, the Active signal is disabled, and the Standby signal is enabled. At this time, to initialize a voltage level of a second divided-voltage detection output terminal B to a level of operation power voltage VDD, the PMOS transistor MP1 is turned on.

The standby regulating unit 321 and the active regulating unit 331 operate alternately as shown in FIG. 3. After time point t6, however, assume that a read command is applied. In this instance, the Active signal is enabled for an extended time T1 and the Standby signal is disabled during time T1. As a result, the operation of the standby regulating unit 321 is delayed, and a voltage on detection terminal Vwl_read may drop below level L1 as illustrated by marker P1 in FIG. 3. This problem may decrease read margin when a voltage level of the detection output terminal Vwl_read is applied to a word line in a read operating mode.

Therefore it is first of all important to develop a regulating technique to supply a required precise and stable voltage in an operating mode of a nonvolatile semiconductor memory, for example during a read operation.

SUMMARY OF THE INVENTION

Accordingly, embodiments of the invention provide a nonvolatile semiconductor memory, a voltage regulator of a nonvolatile semiconductor memory capable of stably providing a required voltage in various operating modes, a read voltage regulator of a nonvolatile semiconductor memory capable of stably producing a word line voltage required in a read operation, and an improved voltage regulating method capable of stabilizing read voltage and increasing a sensing margin.

Embodiments of the invention decouple the operation of the standby regulating unit and the active regulating unit of a voltage regulator so that both can operate simultaneously, for example during a read operation. In embodiments of the invention, the standby regulating unit includes a short pulse generator and a feedback loop to disable the standby regulating unit for a predetermined amount of time.

Embodiments of the invention provide a voltage source for a semiconductor device, including: an output terminal of the voltage source; a standby regulator coupled to the output terminal and configured to determine whether a voltage on the output terminal reaches a low threshold value; and an active regulator coupled to the output terminal and configured to determine whether the voltage on the output terminal reaches a high threshold value, the activation of the standby regulator being independent of the active regulator.

Embodiments of the invention provide a method for regulating a voltage, including: determining whether the voltage reaches a low threshold; if the voltage reaches the low threshold, outputting a too_low signal; activating a high-voltage pump in response to the too_low signal; and activating a short pulse in response to the too_low signal.

According to some embodiments of the invention described above, a voltage can be stably supplied to a semiconductor device. In employing a regulator of the invention in a read voltage supplier of a nonvolatile semiconductor memory, a word line voltage can be supplied stably and a sensing margin can be increased. Accordingly, a reliability characteristic for read operation in a nonvolatile semiconductor memory device and a read performance can be enhanced.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION

Embodiments of the present invention now will be described more fully hereinafter with reference to FIGS. 4 and 5, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
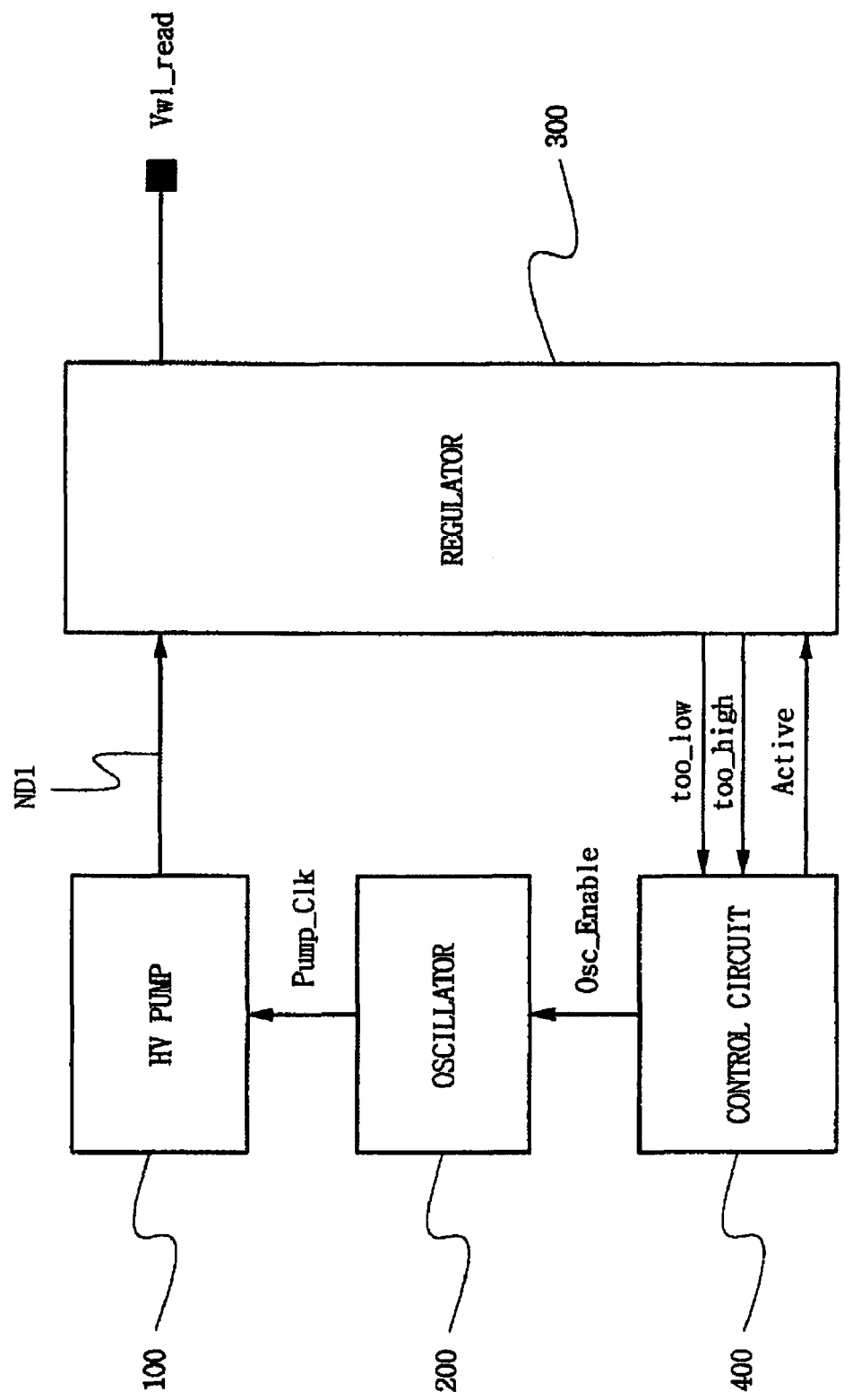
FIG. 1 is a block diagram of a voltage supplier in a nonvolatile semiconductor memory according to the conventional art.
Figure 4:
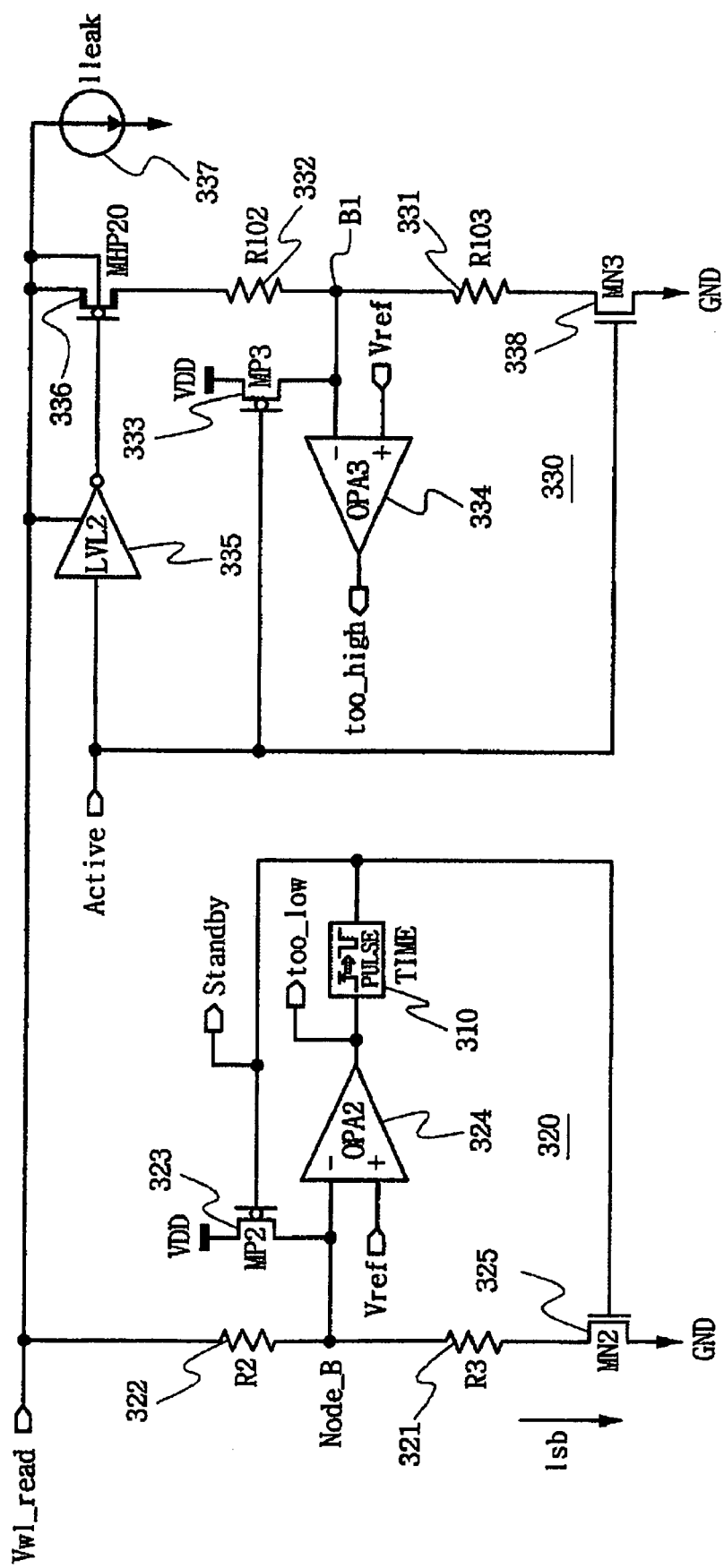
FIG. 4 is a circuit diagram of a regulator according to an embodiment of the invention.

FIG. 4 illustrates in detail a regulator according to an embodiment of the invention. FIG. 5 is a timing diagram for signals identified in FIG. 4. According to embodiments of the invention, the regulator illustrated in FIG. 4 may be used in the conventional art voltage supplier illustrated in FIG. 1.

Figure 3:
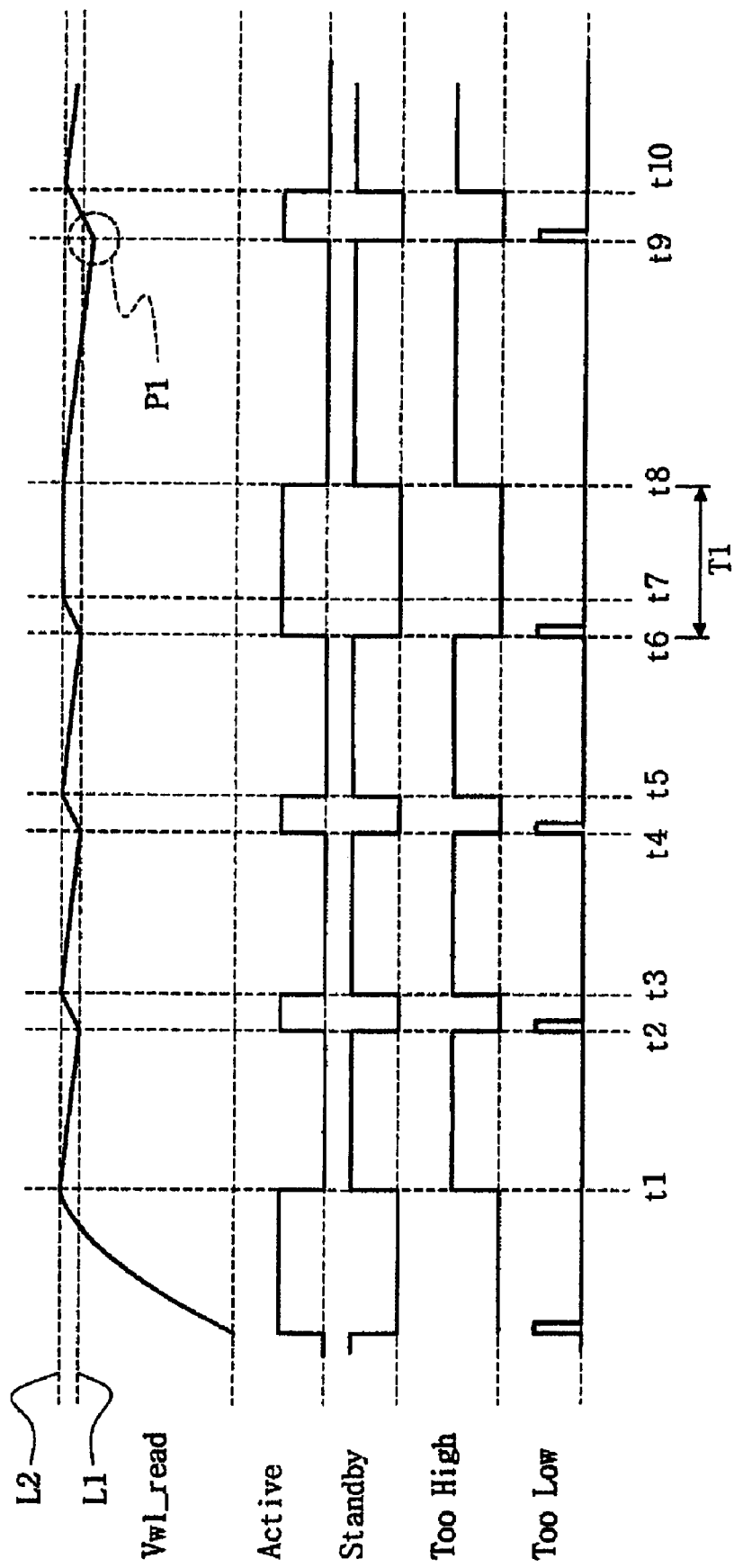
FIG. 3 is a timing diagram for signals identified in FIG. 2.

In embodiments of the invention, a disable operation of a standby regulating unit is determined independently from an active regulating unit to substantially eliminate a drop effect illustrated at P1 of FIG. 3. More specifically, in embodiments of the invention, a divided-voltage detection terminal of the standby regulating unit is initialized to a level of power supply voltage without a dependency upon an enable state of the active regulating unit. Accordingly, a response speed of the standby regulating unit is much faster than in the conventional technology, and supply voltage can be stabilized even during multiple read operations.

Figure 2:
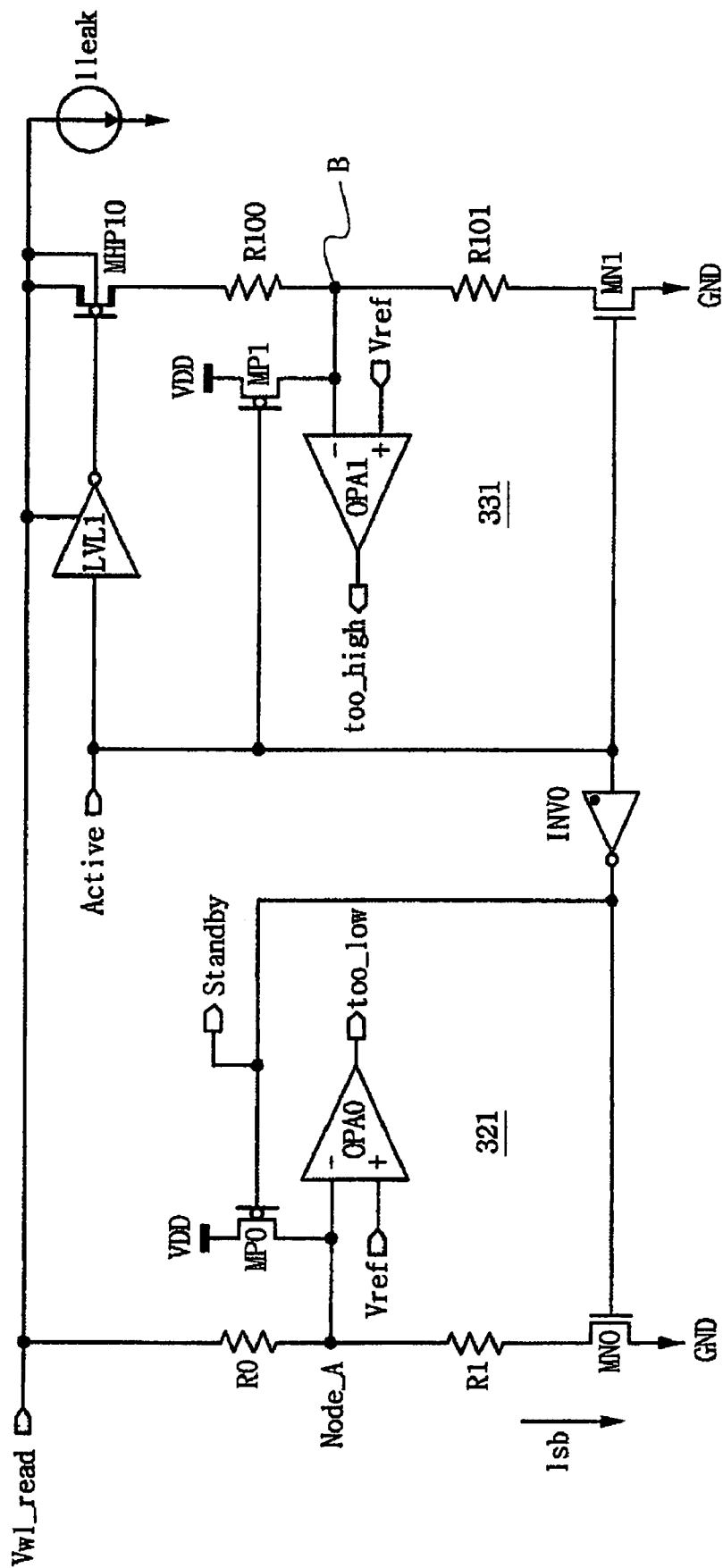
FIG. 2 is a circuit diagram of the regulator in FIG. 1, according to the conventional art.

FIG. 4 illustrates a voltage regulator that differs from the conventional art voltage regulator in FIG. 2. The circuit of FIG. 4 can be advantageously employed in supplying read voltage in a semiconductor device, particularly in a NOR-type nonvolatile semiconductor memory having a plurality of multilevel cells.

For the voltage regulator in FIG. 4, a pulse width of the Standby signal of the first regulating circuit 320 does not depend upon an enable pulse width of the Active signal associated with the second regulating circuit 330. Consequently, the first regulating circuit 320 performs a disable operation for an initialization of the circuit for only a predetermined time independently from operation of the second regulating circuit 330. In embodiments of the invention, an automatic feedback loop is also formed in the standby section.

In FIG. 4, a first regulating circuit 320 includes resistors 322 and 321, MOS transistors 323 and 325, a comparator 324, and a short pulse generator 310. In the configuration of FIG. 4, the first comparator 324 compares a voltage level at the first divided-voltage detection output terminal Node_B with a predetermined reference voltage Vref and produces a first detection signal too_low. The signal too_low requires a rise in a voltage level of the detection output terminal Vwl_read.

The short pulse generator 310 and the MOS transistor 323 constitute a constant time disabling unit. The short pulse generator 310 generates a short pulse Standby signal at a logic low level in response to a rising edge of the first detection signal too_low. The MOS transistor 323 is activated for a time corresponding to the short pulse Standby, supplying power supply voltage VDD to the first divided-voltage detection output terminal Node_B.

A second regulating circuit 330 includes resistors 332 and 331, MOS transistors 333, 338 and 336, a comparator 334, and an inverter 335. In the configuration shown in FIG. 4, the comparator 334 compares a voltage level of second divided-voltage detection output terminal B1 with a level of the predetermined reference voltage Vref and produces a second detection signal too_high. Signal too_high requires a drop in a voltage level of detection output terminal Vwl_read.

In the circuit of FIG. 4, the short pulse generator 310 supplies the Standby signal rather than the inverter INV0 of FIG. 2.

The constant time disabling unit shown in FIG. 4 (i.e., the short pulse generator 310 that is coupled to the transistor 323) initializes a voltage on the first divided-voltage detection output terminal Node_B to a level of power supply voltage VDD at time interval in response to the first detection signal too_low of the first comparator 324 without dependence upon the operation of the second regulating circuit 330.

Figure 5:
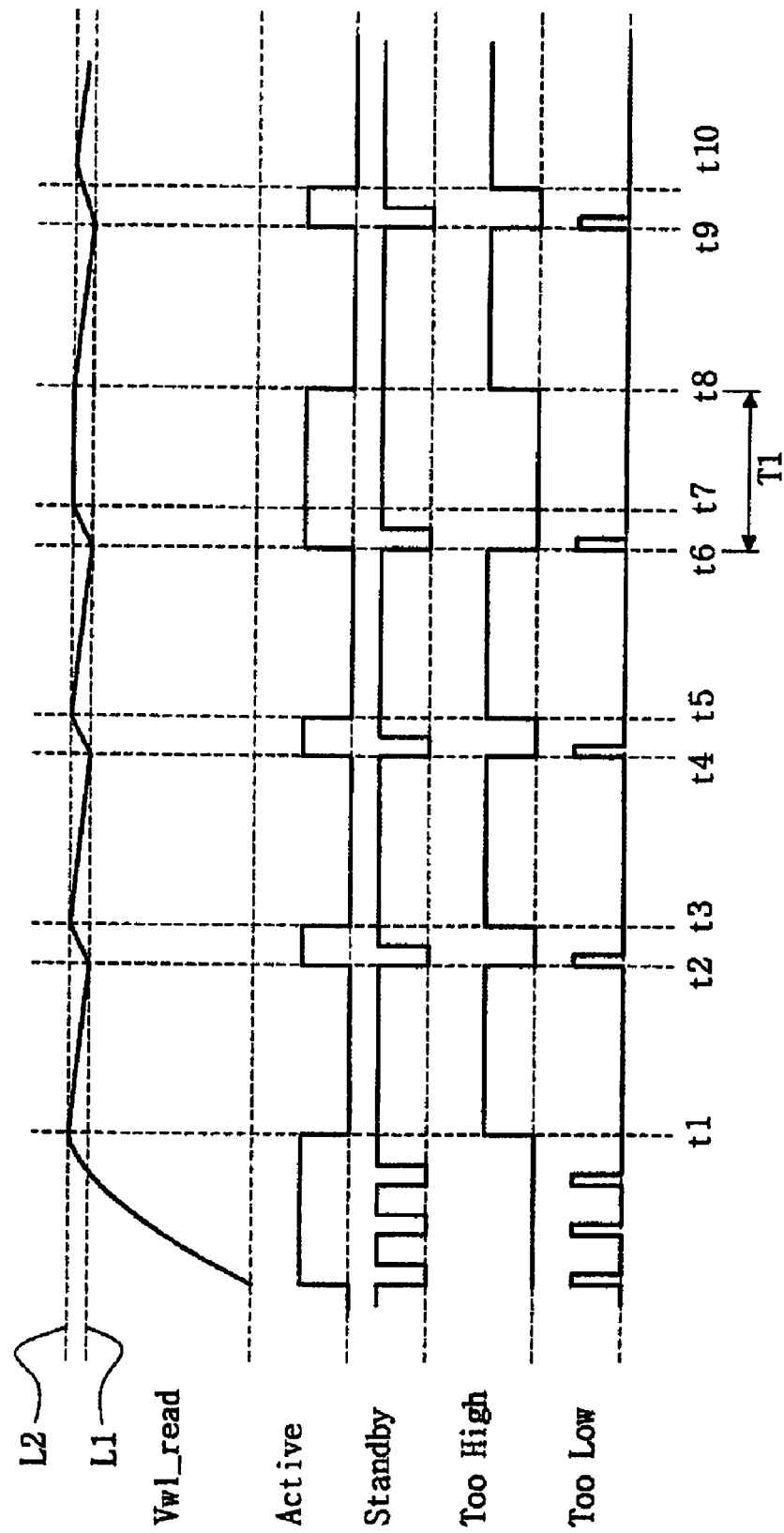
FIG. 5 is a timing diagram for signals identified in FIG. 4.

Referring to FIG. 5, the disable time of the Standby signal associated with the first regulating circuit 320 is constant regardless of the pulse width of the Active signal associated with the second regulating circuit 330.

In FIG. 4, resistors 322, 321, 332 and 331 have resistance values R2, R3, R102, and R103, respectively. To substantially reduce a standby current Isb, a time constant RC associated with the regulating circuit 320 is greater than a time constant RC associated with the regulating circuit 330. Accordingly, the ratio of voltage dividing resistance in each of the regulating units 320 and 330 may be the same (i.e., R2/R3=R012/R103), but total resistance values in the regulating circuit 320 may be much greater than the total resistance values in the regulating circuit 330 (i.e., (R2+R3)>>(R102+R103)).

Between time points t1 and t2 of FIG. 5, when the Active signal is disabled a voltage level of the detection output terminal Vwl_read begins to gradually fall toward a first level L1 by leakage current [Ileak (Ileak>>Isb)]. At this time, the standby regulating circuit 320 is enabled and operating. When the voltage level of the detection output terminal Vwl_read falls to the first level L1, a voltage level of the first divided-voltage detection output terminal Node_B becomes lower than a level of the predetermined reference voltage Vref, and the comparator 324 outputs a first detection signal, that is, the too_low signal. When control circuit 400 of FIG. 1 receives the too_low signal, the Active signal is enabled. In this case, high voltage pump 100 of FIG. 1 also performs a charge pumping, and a voltage level of the detection output terminal Vwl_read begins to gradually rise toward the second level L2 from the time point t2. When the active regulating circuit 330 is enabled and starts to operate, the transistor 333 is turned off. Meanwhile, separately from operation of the active regulating circuit 330, the Standby signal is produced corresponding to a low pulse width of the short pulse generator 310, and transistor 323 is turned on for a time corresponding to the low pulse width. The activation of the transistor 323 initializes the voltage level of the first divided-voltage detection output terminal Node_B to a level of power supply voltage VDD. The activation of the transistor 323 corresponds to the low pulse width of the short pulse generator 310 regardless of the state of the Active signal. That is, a disable time of the standby regulating circuit 320 is determined based on a time interval provided by the short pulse generator after the too_low signal is output by the comparator 324.

The enable operation of the regulating circuit 330 lasts in a section of from t2 to t3 in time points of FIG. 5. After a time t3, the regulating unit 330 produces the too_high signal as a logic high. At this time, the transistor 323 has already been deactivated. When the too_high signal is output to the control circuit 400, the Active signal is disabled, Accordingly, the transistor 333 is turned on to initialize a voltage level of second divided-voltage detection output terminal B1 to a level of the power supply voltage VDD. The Standby signal has been already enabled before the Active signal is disabled.

If, for example, a read command is applied after a time point t6, even though the voltage level of the detection output terminal Vwl_read is uneven during a time period when the Active signal is at an enabled state, time required to initialize the voltage level at the first divided-voltage detection output terminal Node_A is rarely effected. Therefore, the voltage level at the detection output terminal Vwl_read does not fall below the L1 threshold for the time period T1.

Although a response speed of the standby regulating circuit 320 is slower than a response speed of the active regulating unit 330, it is difficult to bring about a case that the voltage level of the detection output terminal Vwl_read falls below the L1 threshold.

The constant time disabling unit (including the short pulse generator 310 that is coupled to the transistor 323) operates so that the first divided-voltage detection output terminal Node_B is initialized within a predetermined time interval in response to the first detection signal too_low without depending upon operation of the second regulating unit 330. Thus the disable time of the Standby signal is constant. Consequently, the regulating circuit 320 can promptly detect whether or not a voltage level of the detection output terminal Vwl_read has dropped below the lower threshold level L1.

In a voltage regulator according to embodiments of the invention described above, voltage necessary for semiconductor device operation can be supplied stably. For example, a regulator according to embodiments of the invention can stably supply a read voltage to a word line in a nonvolatile semiconductor memory having a multilevel cell, thus increasing a sensing margin. Accordingly, reliability and read performance in a nonvolatile semiconductor memory device can be enhanced.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, a circuit device such as a pulse generator etc. used for an independent initializing scheme may be replaced with other similar devices, a level of supply voltage may be determined differently, or other components of a regulator may be varied, without deviating from the scope of the invention. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A voltage source for a semiconductor device, comprising:
an output terminal of the voltage source;
a standby regulator coupled to the output terminal and configured to determine whether a voltage on the output terminal reaches a low threshold value, wherein the standby regulator includes;
a divided-voltage node coupled to the output terminal;
a comparator coupled to the divided-voltage node at a first comparator input and a reference voltage at a second comparator input;
a short-pulse generator coupled to an output of the comparator; and
a first metal-oxide-semiconductor (MOS) transistor, wherein an output of the short-pulse generator is coupled to a gate of the first MOS transistor, a source of the first MOS transistor is coupled to a power supply voltage, and a drain of the first MOS transistor is coupled to the divided-voltage node; and
an active regulator coupled to the output terminal and configured to determine whether the voltage on the output terminal reaches a high threshold value, the activation of the standby regulator being independent of the active regulator.

2. The voltage source of claim 1, wherein the standby regulator includes a disabling circuit, the disabling circuit configured to disable the ability of the standby circuit to determine whether the voltage on the output terminal reaches the low threshold value.

3. The voltage source of claim 2, wherein the disabling circuit includes the short pulse generator.

4. The voltage source of claim 1, further comprising a control circuit coupled to the standby regulator and the active regulator, the standby regulator configured to output a too_low signal to the control circuit when the standby regulator determines that the voltage on the output terminal has reached the low threshold value.

5. The voltage source of claim 4, wherein the control circuit is further configured to output an activation signal to the active regulator in response to the too_low signal.

6. The voltage source of claim 4, further including:
an oscillator coupled to the control circuit; and
a high-voltage pump coupled to the oscillator and the output terminal of the voltage source, the control circuit further configured to output an oscillation enable signal to the oscillator in response to the too_low signal, the oscillator configured to output a pump signal to the high-voltage pump in response to the enable signal, the high-voltage pump configured to pump a high voltage into the output terminal of the voltage source in response to the pump signal.

7. The voltage source of claim 6, wherein the active regulator is configured to output a too_high signal to the control circuit when the active regulator determines that the voltage on the output terminal has reached the high threshold value.

8. The voltage source of claim 7, wherein the control circuit is further configured to deactivate the oscillation enable signal in response to the too_high signal.

9. The voltage source of claim 1, wherein the standby regulator further includes:
a first resistor coupled between the output terminal of the voltage source and the divided voltage node; and
a second resistor coupled between the divided-voltage node and ground.

10. The voltage source of claim 9, wherein the standby regulator further includes a second MOS transistor, the output of the short-pulse generator coupled to a gate of the second MOS transistor, a source of the second MOS transistor coupled to the second resistor, and a drain of the second MOS transistor coupled to ground.

11. The voltage source of claim 1, wherein the active regulator includes:
a divided-voltage node coupled to the output terminal;
a comparator coupled to the divided-voltage node at a first comparator input and a reference voltage at a second comparator input; and
a first metal-oxide-semiconductor (MOS) transistor, an input terminal of the active regulator coupled to a gate of the first MOS transistor, a source of the first MOS transistor coupled to a power supply voltage, and a drain of the first MOS transistor coupled to the divided-voltage node.

12. The voltage source of claim 11, wherein the active regulator further includes:
a first resistor coupled between the output terminal of the voltage source and the divided voltage node; and
a second resistor coupled between the divided-voltage node and ground.

13. The voltage source of claim 12, wherein the active regulator further includes
a second MOS transistor, the input terminal of the active regulator coupled to a gate of the second MOS transistor, a source of the second MOS transistor coupled to the second resistor, and a drain of the second MOS transistor coupled to ground.

14. The voltage source of claim 13, wherein the active regulator further includes a third MOS transistor, a source of the third MOS transistor coupled to the output terminal of the voltage source, and a drain of the third MOS transistor coupled to the first resistor.

15. The voltage source of claim 14, wherein the active regulator further includes an inverter, the inverter input coupled to the input terminal of the active regulator, the inverter output coupled to a gate of the third MOS transistor.

* * * * *